United States Patent
Ito

(10) Patent No.: US 7,181,658 B2
(45) Date of Patent: Feb. 20, 2007

(54) METHOD FOR TESTING SEMICONDUCTOR MEMORY DEVICE AND TEST CIRCUIT FOR SEMICONDUCTOR MEMORY DEVICE

(75) Inventor: Munehiro Ito, Kawasaki (JP)

(73) Assignee: NEC Electronics Corporation (JP)

( * ) Notice: Subject to any disclaimer, the term of this patent is extended or adjusted under 35 U.S.C. 154(b) by 315 days.

(21) Appl. No.: 10/723,278

(22) Filed: Nov. 24, 2003

(65) Prior Publication Data

US 2004/0117696 A1 Jun. 17, 2004

(30) Foreign Application Priority Data

Nov. 29, 2002 (JP) ............................. 2002-349275

(51) Int. Cl.
*G11C 29/00* (2006.01)

(52) U.S. Cl. ...................... 714/718; 714/30; 714/733; 365/201

(58) Field of Classification Search ...................... None
See application file for complete search history.

(56) References Cited

U.S. PATENT DOCUMENTS

| | | | | |
|---|---|---|---|---|
| 4,692,901 A | * | 9/1987 | Kumanoya et al. | .... 365/189.04 |
| 5,548,596 A | * | 8/1996 | Tobita | ........................ 714/719 |
| 5,587,950 A | * | 12/1996 | Sawada et al. | ............. 365/201 |
| 5,659,549 A | * | 8/1997 | Oh et al. | ...................... 714/720 |
| 5,703,818 A | * | 12/1997 | Osawa | ........................ 365/201 |
| 6,317,373 B1 | * | 11/2001 | Tanimura | ..................... 365/201 |
| 6,421,797 B1 | * | 7/2002 | Kim | ............................ 714/718 |
| 6,650,583 B2 | * | 11/2003 | Haraguchi et al. | .......... 365/201 |
| 6,907,555 B1 | * | 6/2005 | Nomura et al. | .............. 714/719 |

FOREIGN PATENT DOCUMENTS

| | | |
|---|---|---|
| JP | 7-78495 | 3/1995 |
| JP | 07-078495 | * 3/1995 |

* cited by examiner

*Primary Examiner*—Albert Decady
*Assistant Examiner*—John P. Trimmings
(74) *Attorney, Agent, or Firm*—Ostrolenk, Faber, Gerb & Soffen, LLP

(57) ABSTRACT

In synchronization with a PLL clock PCK having a frequency four times that of an external clock ECK, n number of internal addresses IAD including an external address EAD are generated and, in synchronization with the PLL clock PCK, n bits of internal write data ITD are generated to be written into a RAM macro 12. Thereafter, the external address EAD is latched, n number of the internal addresses IAD including the external address EAD are generated in synchronization with the PLL clock PCK, n bits of internal read data ITQ corresponding to n number of the internal addresses IAD are read from the RAM macro 12 in synchronization with the PLL clock PCK and the internal read data ITQ corresponding to the internal address IAD which coincides with a latch address LAD among n number of the internal addresses IAD is outputted.

9 Claims, 8 Drawing Sheets

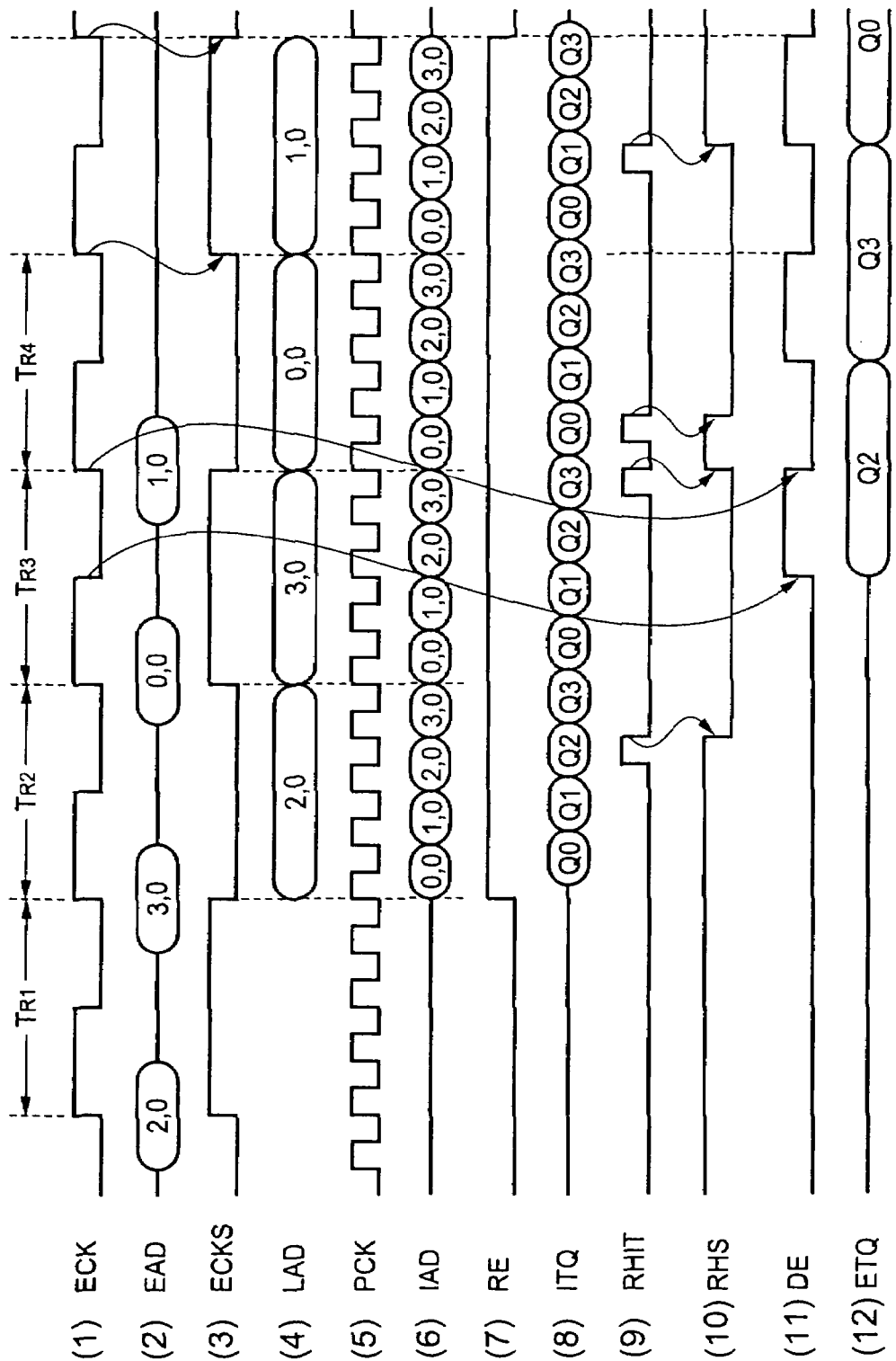

METHOD FOR TESTING SEMICONDUCTOR MEMORY DEVICE AND TEST CIRCUIT FOR SEMICONDUCTOR MEMORY DEVICE

BACKGROUND OF THE INVENTION

1. Field of the Invention

The present invention relates to a method for testing a semiconductor memory device, a test circuit for a semiconductor memory device, the semiconductor memory device and a semiconductor device. More particularly, the present invention relates to a method for testing whether or not data can be normally written into and read from a semiconductor memory device, a test circuit for a semiconductor memory device, a semiconductor memory device including the test circuit and a semiconductor device including a SOC (System On a Chip) (trademark) and the like. Specifically, in the SOC, a system including the test circuit, the semiconductor memory device, a CPU (central processing unit), a plurality of input/output means and the like, all of which are connected with each other via a bus, is built in one semiconductor chip.

2. Description of the Prior Art

In recent years, it is well known that information electronics include a SOC (System On a Chip) (trademark) in which a system includes a semiconductor memory device, a CPU (central processing unit), a plurality of input/output devices and the like, all of which are connected with each other via a bus, is built in one semiconductor chip. It is also well known that various methods for testing functions and performance of the above-described SOC have been developed. Particularly, a method for testing a semiconductor memory device mounted on the SOC is also well known. Such a method for testing a semiconductor memory device is disclosed, for example, in Japanese Patent Laid-Open No. Hei 7 (1995)-78495.

FIG. 1 depicts a block diagram showing a configuration example of a part of a semiconductor device to which a conventional method for testing a semiconductor memory device is applied.

The semiconductor device of this example includes: a PLLC (Phase Locked Loop Circuit) 1; an AGC (Address Generating Circuit) 2; a DGC (Data Generating Circuit) 3; a synchronous RAM macro 4; a DC (Data Comparator) 5; and switches 6 to 10. The switches 6 to 10 are all turned on in a normal operation of the semiconductor device of this example and are all turned off in testing. In testing, the PLLC 1 generates an internal clock ICK having a frequency four times that of an external clock ECK. In testing, the AGC 2 generates addresses of LSB two bits out of addresses A0 to An of n bits (n is a natural number) to be supplied to the RAM macro 4, in synchronization with the internal clock ICK.

In testing, the DGC 3 generates internal data IDT corresponding to external data EDT supplied from the outside, in synchronization with the internal clock ICK. In testing, based on a write enable signal WE supplied from the outside, the synchronous RAM macro 4 stores the internal data IDT supplied from the DGC 3 in storage regions corresponding to the addresses A2 to An of MSB (n−2) bits supplied from the outside and to the addresses A0 and A1 of LSB two bits supplied from the AGC 2, in synchronization with the internal clock ICK. In testing, the DC 5 compares output data read from the synchronous RAM macro 4 to an expected value pattern supplied from the outside.

As a result, the DC 5 determines whether or not the output data are strings of alternate 1s and 0s and its first data coincides with the expected value pattern and outputs a determination result TR.

The present inventor has recognized that storage capacity of the semiconductor memory device tends to increase year by year. Accordingly, a chip area is increased and miniaturization of a pattern is advanced. Thus, it has become more and more difficult to eliminate occurrence of defective memory cells incapable of writing and reading data in one semiconductor memory device.

In order to avoid the above-described problem, rescue of memory cells has been conventionally performed in the following manner. Specifically, extra rows and columns of memory cells (redundant memory cells) more than necessary storage capacity are provided in the semiconductor memory device and, in a probing test step of examining electrical characteristics and the like, a row including defective memory cells or a column including defective memory cells is replaced with the row of redundant memory cells or the column thereof. Thus, yield of the semiconductor memory device as a product has been improved.

In order to replace the above-described defect memory cells with the redundant memory cells, it is required to perform write and read of data for each of memory cells of the semiconductor memory device and determine whether the memory cell is a normal memory cell or a defective memory cell.

However, in the above-described conventional method for testing a semiconductor memory device, the DC 5 compares 4-bit output data read from the synchronous RAM macro 4 to a 4-bit expected value pattern supplied from the outside and determines whether or not the data and the pattern coincide with each other. Thus, there was a drawback that, even if the 4-bit output data is determined not to coincide with the 4-bit expected value pattern, it is impossible to determine which one of four memory cells corresponding to the 4-bit output data is not usable (fail). Consequently, the above-described conventional method for testing a semiconductor memory device cannot be used in the above-described probing test step.

On the above-described point, high-speed determination as described below is conceivable. Specifically, by supplying addresses one at a time from the outside in synchronization with the same clock as a high-speed internal clock ICK used in the semiconductor memory device, write and read of data is performed per bit to determine at high speed whether one corresponding memory cell is usable (pass) or not usable (fail).

However, in the above-described probing test step, it is required to perform arithmetic processing as to which one of memory cells of which one of semiconductor memory devices formed on a semiconductor wafer is a defective memory cell and to store the result thereof in storage means called a fail memory.

Therefore, the above-described arithmetic processing cannot keep up with such a high-speed test method. Thus, the method cannot be used in the foregoing probing test step.

The present invention was made in consideration of the above-described circumstances. It is an object of the present invention to provide a method for testing a semiconductor memory device, which is capable of obtaining read data corresponding to one external address one-on-one even if a high-speed internal clock obtained by multiplying a low-speed external clock is used, a test circuit for the semiconductor memory device, the semiconductor memory device and a semiconductor device.

SUMMARY OF THE INVENTION

In a method for testing a semiconductor memory device according to the present invention, as a first step, first, in synchronization with a high-speed clock which has a frequency n times that of an external clock (n is a natural number) and is synchronized with the external clock, n number of internal addresses including an external address supplied for designating a storage region of data for 1 bit to be written into a storage. unit of a semiconductor memory device are generated. Simultaneously, n bits of internal write data corresponding to n number of the internal addresses are generated in synchronization with the high-speed clock.

As a second step, an external address supplied for designating a storage region of data for 1 bit to be read from the storage unit is latched and n number of internal addresses including the external address are generated in synchronization with the high-speed clock. Simultaneously, n bits of internal read data corresponding to n number of the internal addresses are read from the storage unit in synchronization with the high-speed clock and the internal read data corresponding to the internal address, which coincides with the latched external address, out of n number of the internal addresses is outputted.

BRIEF DESCRIPTION OF THE DRAWINGS

FIG. 8 depicts another timing chart for explaining the method for testing a semiconductor memory device.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First, with reference to the drawings, embodiments of the present invention will be described in detail.

Figure 1:
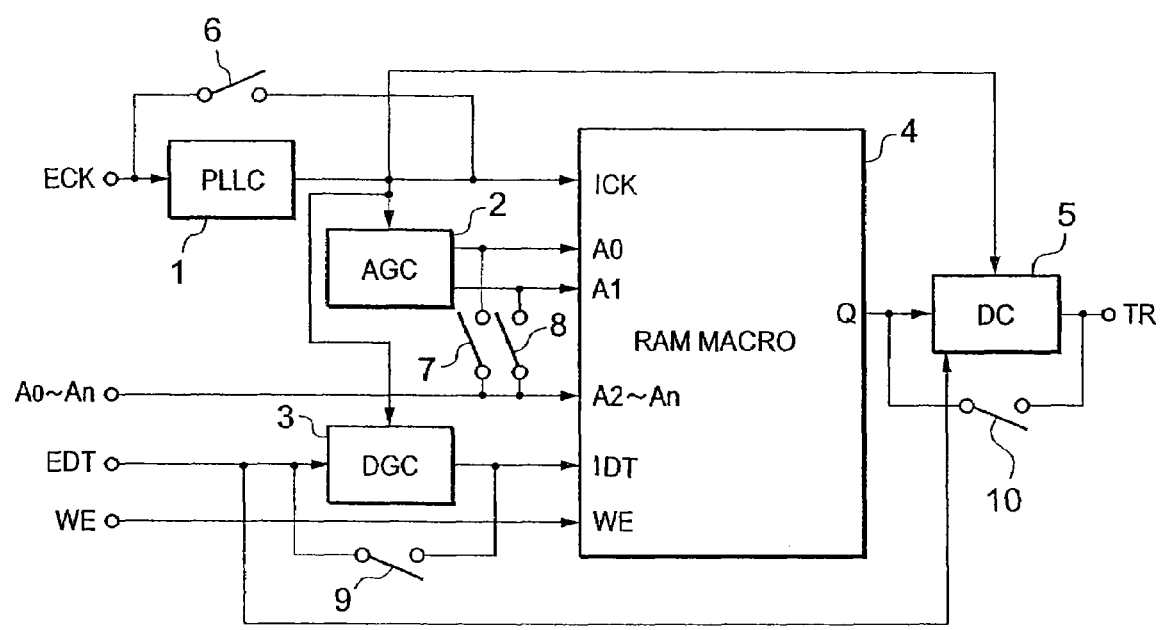
FIG. 1 depicts a block diagram showing a configuration example of a part of a semiconductor device to which a method for testing a conventional semiconductor memory device is applied.
Figure 2:
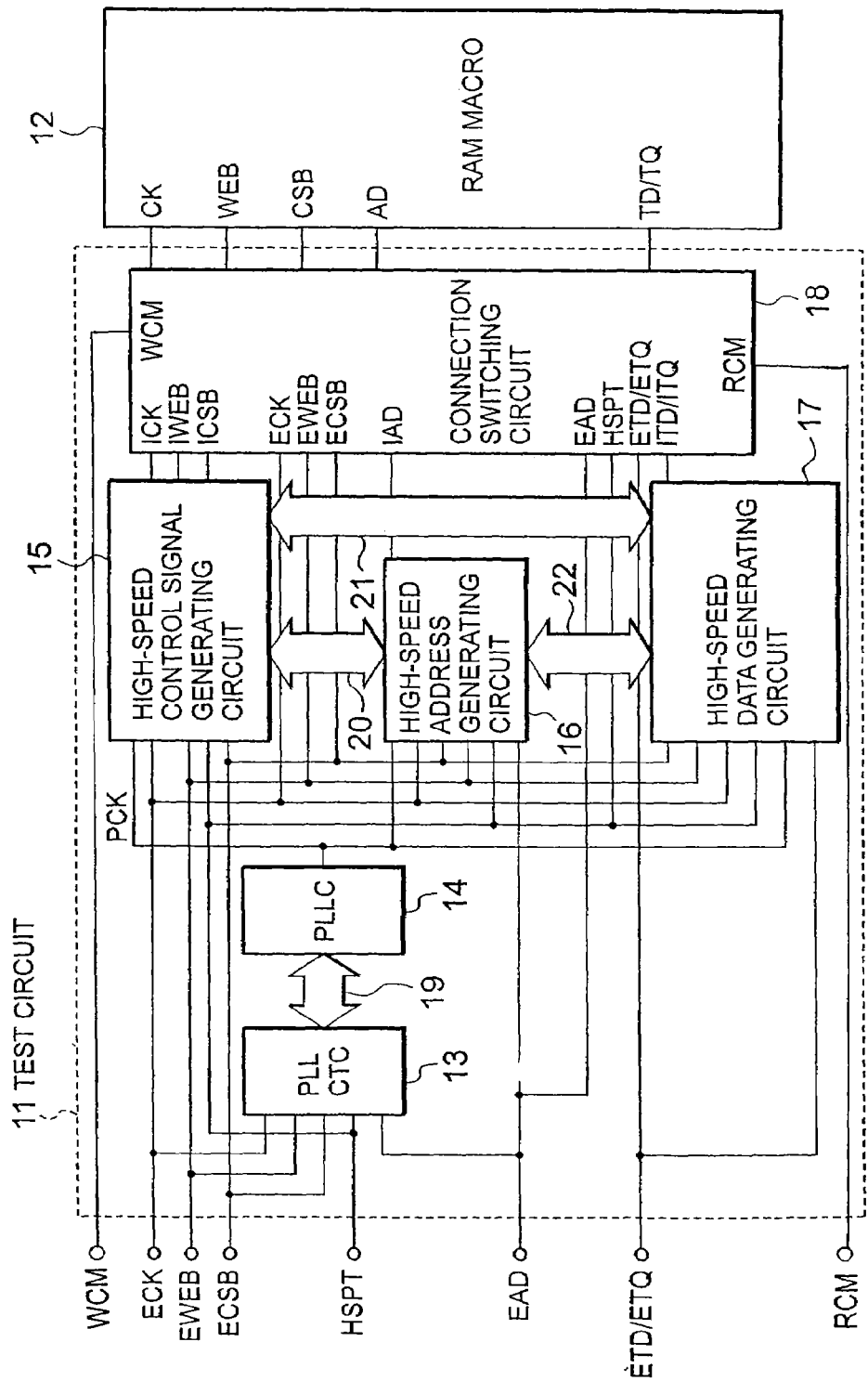
FIG. 2 depicts a block diagram showing a configuration of a part of a semiconductor memory device to which a method for testing a semiconductor memory device, that is one embodiment of the present invention, is applied.

FIG. 2 depicts a block diagram showing a configuration of a part of a semiconductor memory device to which a method for testing a semiconductor memory device, that is a first embodiment of the present invention, is applied.

The semiconductor memory device of this embodiment includes a test circuit 11 and a RAM macro 12. The test circuit 11 includes: a PLL controlling circuit (PLLCTC) 13; a PLLC 14; a high-speed control signal generating circuit 15; a high-speed address generating circuit 16; a high-speed data generating circuit 17; a connection switching circuit 18; and control buses 19 to 22.

The PLL controlling circuit 13 controls the PLLC 14 via the control bus 19 based on an external clock ECK, an external chip select signal ECSB, an external write enable signal EWEB, a test switch signal HSPT and an external address EAD, which are supplied from the outside, respectively.

The external chip select signal ECSB is a low active signal which allows reception of a command supplied from the outside.

Specifically, when the external chip select signal ECSB is in "L" level, the test circuit 11 is allowed to receive a write command WCM which instructs write of external write data ETD supplied from the outside into the RAM macro 12 or a read command RCM which instructs read of read data TQ read from the RAM macro 12 to the outside.

On the other hand, when the external chip select signal ECSB is in "H" level, the test circuit 11 is in NOP (No Operation) state where reception of the command is not allowed.

The external write enable signal EWEB is a low active signal for allowing write of the external write data ETD supplied from the outside into the RAM macro 12 or read of the read data TQ read from the RAM macro 12 to the outside.

Specifically, if the external write enable signal EWEB is in "L" level when the external chip select signal ECSB is in "L" level, the test circuit 11 receives the write command WCM in synchronization with rise of the external clock ECK.

On the other hand, if the external write enable signal EWEB is in "H" level when the external chip select signal ECSB is in "L" level, the test circuit 11 receives the read command RCM.

The test switch signal HSPT is a signal which instructs a high-speed test using a PLL clock PCK outputted from the PLLC 14 in "H" level and instructs a normal test using an external clock ECK supplied from the outside in "L" level.

The PLLC 14 is controlled by the PLL controlling circuit 13. In the high-speed test, the PLLC 14 generates a, PLL clock PCK which has a frequency n times that of the external clock ECK (n is a natural number, for example, 4) and is synchronized with the external clock ECK. The high-speed control signal generating circuit 15 generates an internal chip select signal ICSB and an internal write enable signal IWEB, which are used in the high-speed test, based on the external clock ECK, the external chip select signal ECSB, the external write enable signal EWEB, the test switch signal HSPT and the external address EAD, which are supplied from the outside, respectively. At the same time, the high-speed control signal generating circuit 15 outputs the PLL clock PCK supplied from the PLLC 14 as an internal clock ICK when the test switch signal HSPT is in "H" level.

Figure 3:
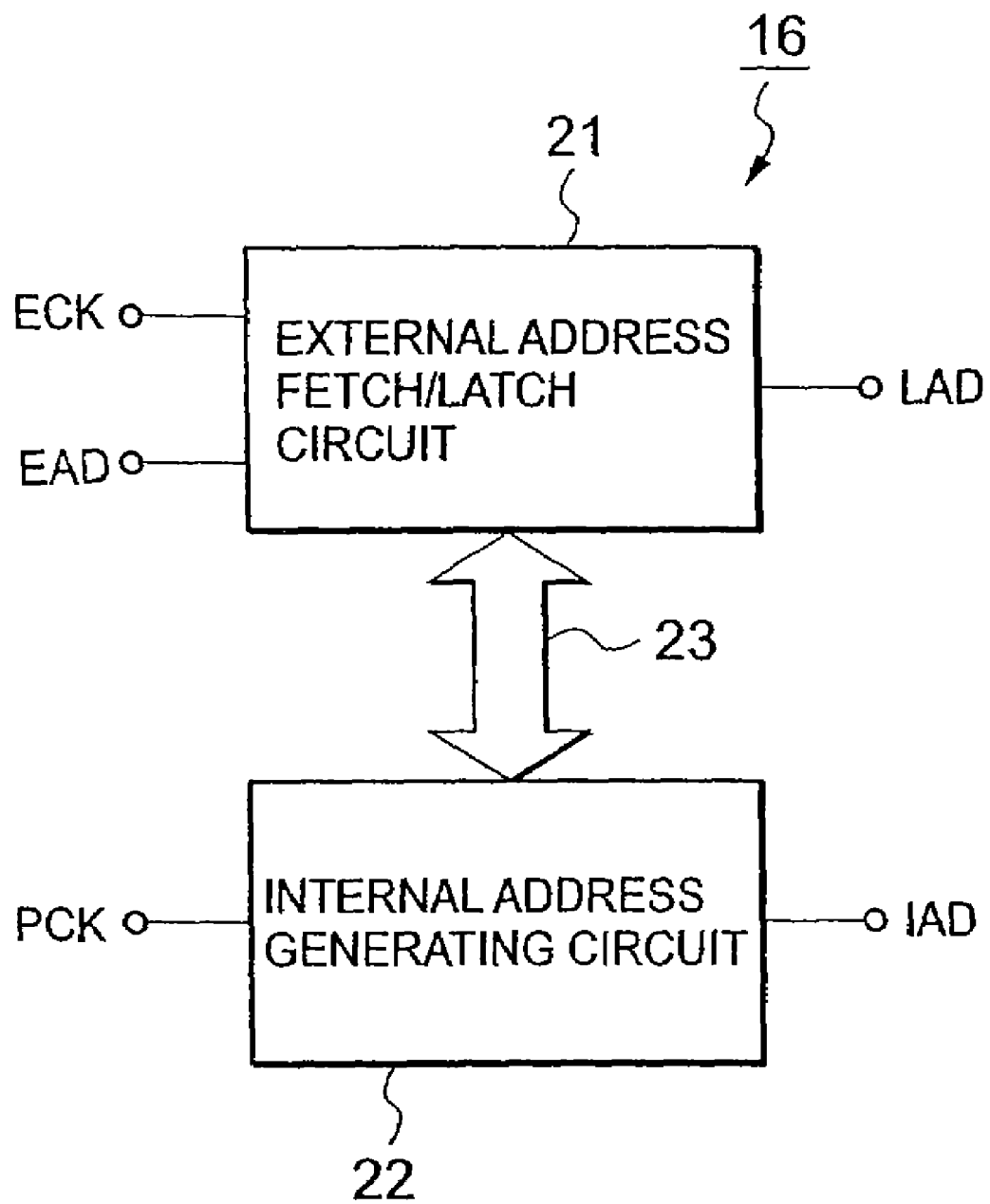
FIG. 3 depicts a block diagram showing a configuration of a high-speed address generating circuit 16 included in the semiconductor memory device.

As shown in FIG. 3, the high-speed address generating circuit 16 includes: an external address fetch/latch circuit 21;

an internal address generating circuit 22; and a control bus 23. After fetching and latching the external address EAD supplied after reception of the read command RCM, the external address fetch/latch circuit 21 supplies the external address EAD to the high-speed data generating circuit 17 as a latch address LAD.

Moreover, the external address fetch/latch circuit 21 transfers the fetched external address EAD to the internal address generating circuit 22 via the control bus 23. The external address EAD is for designating a storage region of 1-bit data to be read from the RAM macro 12. The internal address generating circuit 22 generates four internal addresses IAD including the external address EAD supplied via the control bus 23 from the external address fetch/latch circuit 21, in synchronization with rise of the PLL clock PCK. For example, when the external address EAD is (2, 0), the four internal addresses IAD are (0, 0), (1, 0), (2, 0) and (3, 0). Here, x in (x, y) is a binary 4-bit row address expressed in hexadecimal and y therein is a binary 4-bit column address expressed in hexadecimal.

In write of the high-speed test, the high-speed data generating circuit 17 generates internal write data ITD for n bits corresponding to addresses AD for n bits including the external address EAD of the RAM macro 12, based on the external clock ECK, the external chip select signal ECSB, the external write enable signal EWEB, the test switch signal HSPT and the external address EAD, which are supplied from the outside, respectively, and the PLL clock PCK supplied from the PLLC 14.

Moreover, in read of the high-speed test, based on the external clock ECK, the external chip select signal ECSB, the external write enable signal EWEB, the test switch signal HSPT and the external address EAD, which are supplied from the outside, respectively, and the PLL clock PCK supplied from the PLLC 14, the high-speed data generating circuit 17 selects 1-bit read data corresponding to the external address EAD from n-bit internal read data ITQ which is read from the RAM macro 12 and supplied via the connection switching circuit 18 and outputs the selected read data as external read data ETQ.

Figure 4:
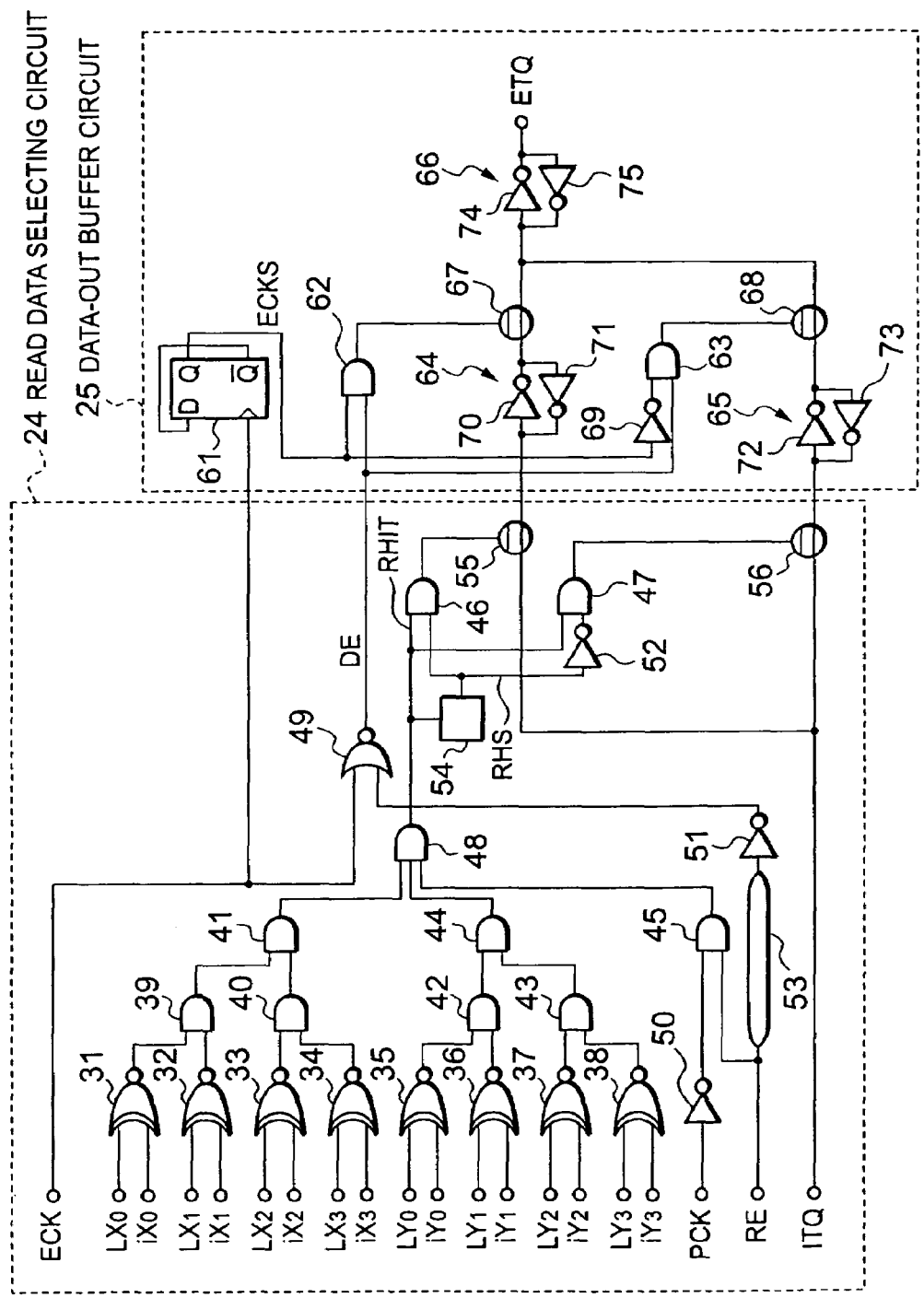
FIG. 4 depicts a block diagram showing a configuration of a part of a high-speed data generating circuit 17 included in the semiconductor memory device.

As shown in FIG. 4, the high-speed data generating circuit 17 includes a read data selecting circuit 24 and a data-out buffer circuit 25. The read data selecting circuit 24 includes: exclusive NOR gates 31 to 38; 2-input AND gates 39 to 47; a 3-input AND gate 48; a NOR gate 49; inverters 50 to 52; a delay 53; a switch signal generating circuit 54; and transfer gates 55 and 56.

The exclusive NOR gate 31 outputs output data of "H" level when the first bit Lx0 of a row address included in the latch address LAD supplied from the external address fetch/latch circuit 21 and the first bit ix0 of a row address included in the internal address IAD supplied from the internal address generating circuit 22 coincide with each other.

Similarly, the exclusive NOR gate 32 outputs output data of "H" level when the second bit Lx1 of the row address included in the latch address LAD and the second bit ix1 of the row address included in the internal address IAD coincide with each other. The exclusive NOR gate 33 outputs output data of "H" level when the third bit Lx2 of the row address included in the latch address LAD and the third bit ix2 of the row address included in the internal address IAD coincide with each other. The exclusive NOR gate 34 outputs output data of "H" level when the fourth bit Lx3 of the row address included in the latch address LAD and the fourth bit ix3 of the row address included in the internal address IAD coincide with each other.

Moreover, the exclusive NOR gate 35 outputs output data of "H" level when the first bit Ly0 of a column address included in the latch address LAD supplied from the external address fetch/latch circuit 21 and the first bit iy0 of a column address included in the internal address IAD supplied from the internal address generating circuit 22 coincide with each other.

Similarly, the exclusive NOR gate 36 outputs output data of "H" level when the second bit Ly1 of the column address included in the latch address LAD and the second bit iy1 of the column address included in the internal address IAD coincide with each other. The exclusive NOR gate 37 outputs output data of "H" level when the third bit Ly2 of the column address included in the latch address LAD and the third bit iy2 of the column address included in the internal address IAD coincide with each other. The exclusive NOR gate 38 outputs output data of "H" level when the fourth bit Ly3 of the column address included in the latch address LAD and the fourth bit iy3 of the column address included in the internal address IAD coincide with each other.

The 2-input AND gate 39 obtains a logical product of the output data of the exclusive NOR gate 31 and the output data of the exclusive NOR gate 32. The 2-input AND gate 40 obtains a logical product of the output data of the exclusive NOR gate 33 and the output data of the exclusive NOR gate 34. The 2-input AND gate 41 obtains a logical product of the output data of the AND gate 39 and the output data of the AND gate 40. The 2-input AND gate 42 obtains a logical product of the output data of the exclusive NOR gate 35 and the output data of the exclusive NOR gate 36. The 2-input AND gate 43 obtains a logical product of the output data of the exclusive NOR gate 37 and the output data of the exclusive NOR gate 38. The 2-input AND gate 44 obtains a logical product of the output data of the AND gate 42 and the output data of the AND gate 43.

The inverter 50 inverts the PLL clock PCK. The 2-input AND gate 45 obtains a logical product of output data of the inverter 50 and a read enable signal RE. The read enable signal RE is a signal to become "H" level for allowing read of 4-bit data from the RAM macro 12 during one cycle of the external clock ECK and is supplied from the high-speed control signal generating circuit 15. The 3-input AND gate 48 obtains a logical product of output data of the AND gates 41, 44 and 45 and outputs a result thereof as a selection signal RHIT. The delay 53 delays the read enable signal RE for one cycle of the external clock ECK. The inverter 51 inverts output data of the delay 53. The NOR gate 49 obtains a logical sum of the external clock ECK and output data of the inverter 51, inverts a result thereof and outputs the result as a data enable signal DE. The switch signal generating circuit 54 generates a switch signal RHS changed by rise of the selection signal RHIT. The 2-input AND gate 46 obtains a logical product of the selection signal RHIT and the switch signal RHS. When an output signal of the AND gate 46 is "H" level, the transfer gate 55 outputs only odd-numbered 1-bit data corresponding to the external address EAD out of the 4-bit internal read data ITQ which is read from the RAM macro 12 and supplied via the connection switching circuit 18. The inverter 52 inverts the switch signal RHS. The 2-input AND gate 47 obtains a logical product of the selection signal RHIT and output data of the inverter 52. When an output signal of the AND gate 47 is "H" level, the transfer gate 56 outputs only even-numbered 1-bit data corresponding to the external address EAD out of the 4-bit internal read data ITQ which is read from the RAM macro 12 and supplied via the connection switching circuit 18.

The data-out buffer circuit 25 includes: a dividing circuit 61; AND gates 62 and 63; latches 64 to 66; transfer gates 67 and 68; and inverters 69 to 75. The dividing circuit 61 is formed of a delay flip-flop (DFF) and outputs divided clocks ECKS obtained by dividing the external clock ECK into two. The AND gate 62 obtains a logical product of the divided clock ECKS and the data enable signal DE. The latch 64 includes the inverters 70 and 71 and latches output data of the transfer gate 55. When output data of the AND gate 62 is "H" level, the transfer gate 67 outputs output data of the latch 64 in synchronization with fall of the external clock ECK. The inverter 69 inverts the divided clock ECKS. The AND gate 63 obtains a logical product of output data of the inverter 69 and the data enable signal DE. The latch 65 includes the inverters 72 and 73 and latches output data of the transfer gate 56. When output data of the AND gate 63 is "H" level, the transfer gate 68 outputs output data of the latch 65 in synchronization with the fall of the external clock ECK. The latch 66 includes the inverters 74 and 75 and, after latching output data of the transfer gate 67 or 68, outputs the latched data as external read data ETQ.

When the test switch signal HSPT is "L" level, the connection switching circuit 18 shown in FIG. 2 supplies the RAM macro 12 with the external address EAD, the external clock ECK, the external write data ETD, the external chip select signal ECSB and the external write enable signal EWEB, which are supplied from the outside, as an address AD, a clock CK, write data TD, a chip select signal CSB and a write enable signal WEB, respectively. At the same time, the connection switching circuit 18 outputs the data read from the RAM macro 12 to the outside as the external read data TQ.

Meanwhile, when the test switch signal HSPT is "H" level, the connecting switching circuit 18 supplies the RAM macro 12 with the internal address IAD supplied from the high-speed address generating circuit 16, the internal clock ICK supplied from the high-speed control signal generating circuit 15, the internal chip select signal ICSB, the internal write enable signal IWEB and the internal write data ITD supplied from the high-speed data generating circuit 17 as an address AD, a clock CK, write data TD, a chip select signal CSB and a write enable signal WEB, respectively. At the same time, the connection switching circuit 18 supplies the high-speed data generating circuit 17 with the data read from the RAM macro 12 as the internal read data ITQ.

Based on the write enable signal WEB supplied from the connection switching circuit 18, the RAM macro 12 stores the write data TD supplied from the connection switching circuit 18 in a storage region corresponding to the address AD supplied from the connection switching circuit 18 in synchronization with the clock CK supplied from the connection switching circuit 18.

Moreover, in synchronization with the clock CK supplied from the connection switching circuit 18, the RAM macro 12 reads the read data TQ from the storage region corresponding to the address AD supplied from the connection switching circuit 18.

Figure 5:
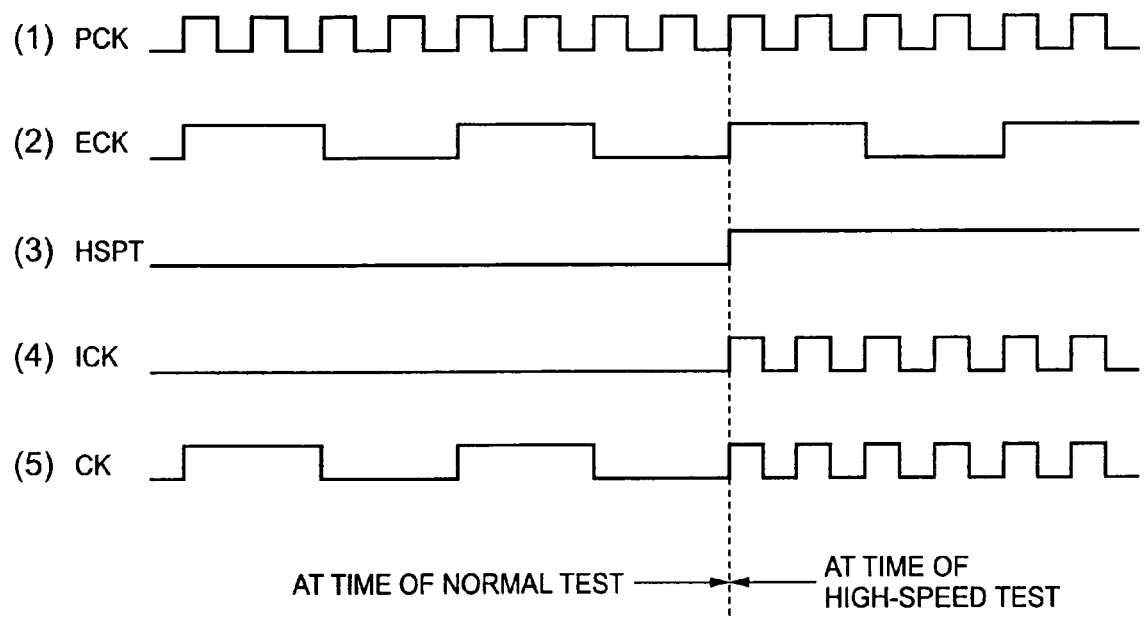
FIG. 5 depicts a timing chart showing a relationship between a PLL clock PCK, an external clock ECK, a test switch signal HSPT, an internal clock ICK and a clock CK in a high-speed control signal generating circuit 15 and a connection switching circuit 18.

Here, FIG. 5 shows a relationship between the PLL clock PCK, the external clock ECK, the test switch signal HSPT, the internal clock ICK and the clock CK in the high-speed control signal generating circuit 15 and the connection switching circuit 18. In the normal test, the test switch signal HSPT shown in FIG. 5 (3) is "L" level, the PLL clock PCK shown in FIG. 5 (1) is not supplied to the high-speed control signal generating circuit 15 and the connection switching circuit 18 supplies the RAM macro 12 with the external clock ECK shown in FIG. 5 (2) as the clock CK (see FIG. 5 (5)). On the other hand, in the high-speed test, the test switch signal HSPT shown in FIG. 5 (3) is "H" level, the PLL clock PCK shown in FIG. 5 (1) is supplied to the high-speed control signal generating circuit 15 and thus the high-speed control signal generating circuit 15 supplies the connection switching circuit 18 with the PLL clock PCK shown in FIG. 5 (1) as the internal clock ICK as shown in FIG. 5 (4). Therefore, the connection switching circuit 18 supplies the RAM macro 12 with the internal clock ICK shown in FIG. 5 (4) as the clock CK (see FIG. 5 (5)).

Figure 6:
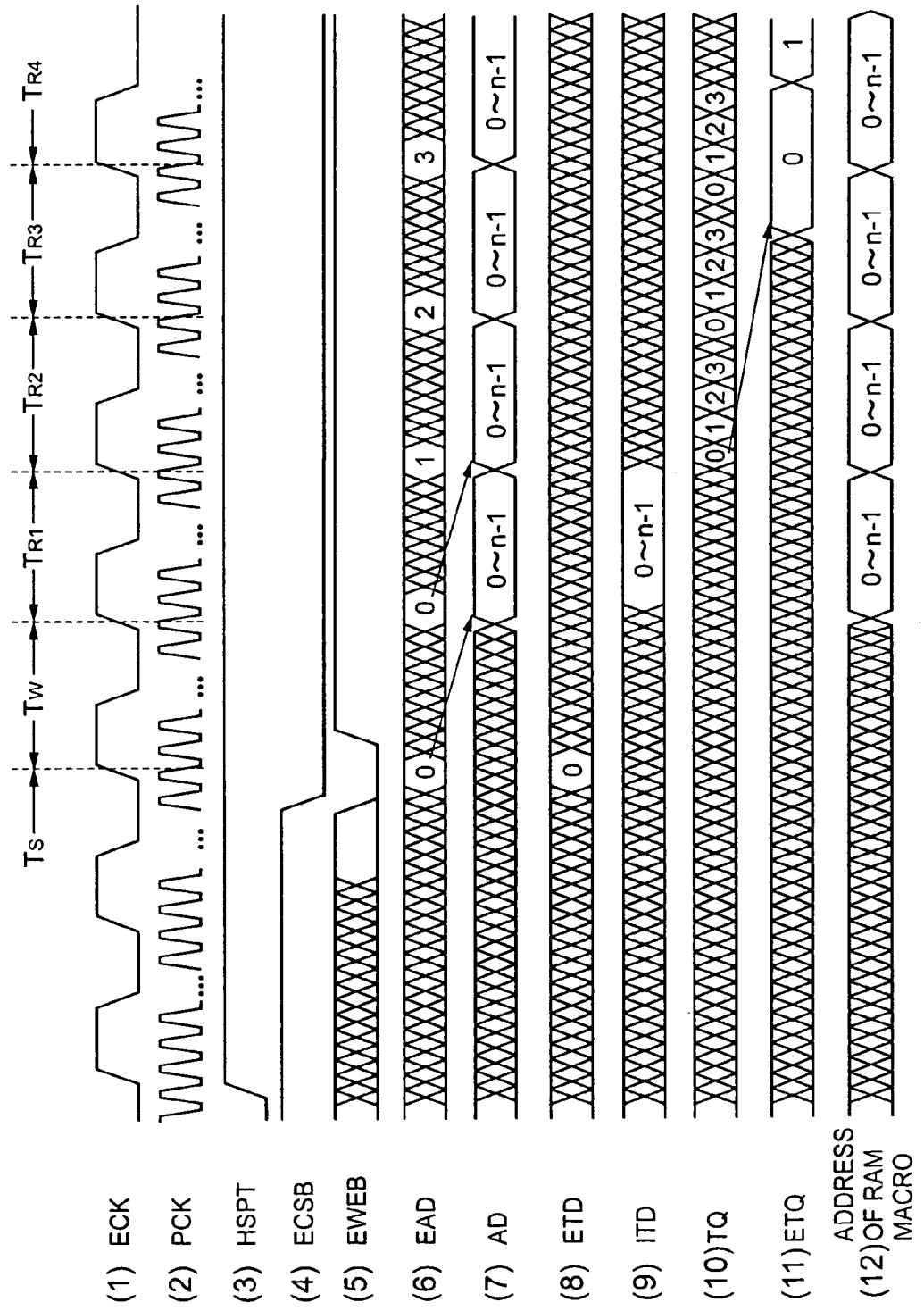
FIG. 6 depicts a timing chart for explaining the method for testing a semiconductor memory device.

Next, a test method in the semiconductor memory device having the above-described configuration will be described. First, this test method will be schematically described with reference to timing charts shown in FIG. 6. After the test switch signal HSPT is set to "H" level as shown in FIG. 6 (3), in a setting cycle TS, a pulse number n (n is a natural number) of the PLL clock PCK (see FIG. 6 (2)) is generated by the PLLC 14 per cycle of the external clock ECK shown in FIG. 6 (1), a method for generating the internal address IAD and a method for generating the internal write data ITD are set. As an example of this setting method, there is one in which, in a state where the test switch signal HSPT is "H" level and the external chip select signal ECSB is "H" level, the external write enable signal EWEB is set to "L" level, an address key is entered in the external address EAD and a mode entry is made by rise of the external clock ECK. Here, the method for generating the internal address IAD means any one of the following three patterns, for example: generating n number of internal addresses IADk (=EAD) (k is a natural number), IADk+1 (=EAD+1), . . . , IADk+n−1 (=EAD+n−1) by sequentially increasing the address of the first given external address EAD; generating n number of internal addresses IADk (=EAD) (k is a natural number), IADk−1 (=EAD−1), . . . , IADk−n+1 (=EAD−n+1) by sequentially decreasing the address of the first given external address EAD; and generating n number of internal addresses IAD0, IAD1, . . . , IADk (=EAD) (k is a natural number), . . . IAD n−1 which include the first given external address EAD and are separated every n number. Moreover, the method for generating the internal write data ITD means any one of the following four patterns, for example: consecutively generating n number of values of "1"; consecutively generating n number of values of "0"; repeating the values "1" and "0" alternately such as "101010 . . . "; and repeating the values "0" and "1" alternately such as "010101 . . . ."

Next, as shown in FIGS. 6 (4) and (5), in a write cycle TW, the external chip select signal ECSB is set to "L" level and the external write enable signal EWEB is set to "L" level for a predetermined period. Thus, the test circuit 11 receives the write command WCM. Thereafter, as shown in FIGS. 6 (8) and (6), the external write data ETD to be written into the RAM macro 12 and the external address EAD for designating a storage region into which the external write data ETD is written are supplied to the test circuit 11 from the outside. In FIG. 6 (8), "0" indicates that the external write data ETD is the value "0". Moreover, in FIG. 6 (6), "0" indicates that the external address EAD is (0, 0), that is, a row address is a binary 4-bit value "0000" and a column address is a binary 4-bit value "0000".

In this write cycle TW, as shown in FIG. 6 (9), n bits of internal write data ITD are generated for one cycle of the external clock ECK in the high-speed data generating circuit 17 and these n bits of internal write data ITD are written into storage regions of the RAM macro 12 corresponding to the internal addresses IAD for n bits (see FIG. 6 (7)) which are generated in the high-speed address generating circuit 16.

The generation of the internal write data ITD and the generation of the internal address IAD in this case are performed in accordance with the method for generating the internal write data ITD and the method for generating the internal address IAD, which are set in the foregoing setting cycle TS. In FIG. 6 (9), "0 to n−1" indicates that n number of the internal write data ITD are generated in the high-speed data generating circuit 17 in accordance with the method for generating the internal write data ITD, which is set in the foregoing setting cycle TS. In FIG. 6 (7), the first "0 to n−1" from the left of the drawing indicates that n number of the internal addresses IAD are generated in accordance with the method for generating the internal address IAD, which is set in the foregoing setting cycle TS, are supplied to the RAM macro 12 via the connection switching circuit 18. Moreover, in FIG. 6 (12), the first "0 to n−1" from the left of the drawing indicates that n number of the internal addresses IAD are supplied to the RAM macro 12 from the high-speed address generating circuit 17 via the connection switching circuit 18 and write processing of n number of write data TD is performed in accordance with the n number of internal addresses IAD.

Note that, in respective cycles of the external clock ECK sequentially following the above-described write cycle TW, a new external address EAD obtained by increasing or decreasing the external address EAD by n is supplied to the test circuit 11 and processing of supplying the external data ETD is repeated. Thus, desired data can be written into all the storage regions of the RAM macro 12.

Next, in the first read cycle TR1, as shown in FIGS. 6 (4) and (5), the external chip select signal ECSB is set to "L" level and the external write enable signal EWEB is set to "H" level. Thus, the test circuit 11 receives the read command RCM. Thereafter, as shown in FIG. 6 (6), the external address EAD for designating a storage region of data to be read as external read data ETQ from the RAM macro 12 is supplied to the test circuit 11 from the outside. In FIG. 6 (6), "0" indicates that the external address EAD is (0, 0), that is, a row address is a binary 4-bit value "0000" and a column address is a binary 4-bit value "0000".

In this first read cycle TR1, as shown in FIG. 6 (7), the internal address IAD for n bits corresponding to the external address EAD for one cycle of the external clock ECK is generated in the high-speed address generating circuit 16. The generation of the internal address IAD in this case is performed in accordance with the method for generating the internal address IAD, which is set in the foregoing setting cycle TS. In FIG. 6 (7), the second "0 to n−1" from the left of the drawing indicates that n number of internal addresses IAD generated in accordance with the method for generating the internal address IAD, which is set in the foregoing setting cycle TS, are supplied to the RAM macro 12. Moreover, in FIG. 6 (12), the second "0 to n−1" from the left of the drawing indicates that read processing of n number of read data TQ is performed in the RAM macro 12 in accordance with n number of the internal addresses IAD supplied from the high-speed address generating circuit 17 via the connection switching circuit 18.

Consequently, as shown in FIG. 6 (10), n number of the read data TQ are read from storage regions corresponding to n number of the internal addresses IAD of the RAM macro 12 and supplied to the high-speed data generating circuit 17 as n number of internal read data ITQ via the connection switching circuit 18. Therefore, as shown in FIG. 6 (11), the high-speed address generating circuit 17 selects 1-bit internal read data ITQ corresponding to the external address EAD one-on-one from n number of the internal read data ITQ and outputs the selected data as external read data ETQ to the outside.

Accordingly, in the respective cycles of the external clock ECK sequentially following this first read cycle TR1, processing of supplying a new address EAD obtained by increasing the external address EAD by 1 to the test circuit 11 is repeated. Thus, desired data can be read from all the storage regions of the RAM macro 12. In FIG. 6, the second to fourth read cycles TR 2 to TR4 are shown.

Figure 7:
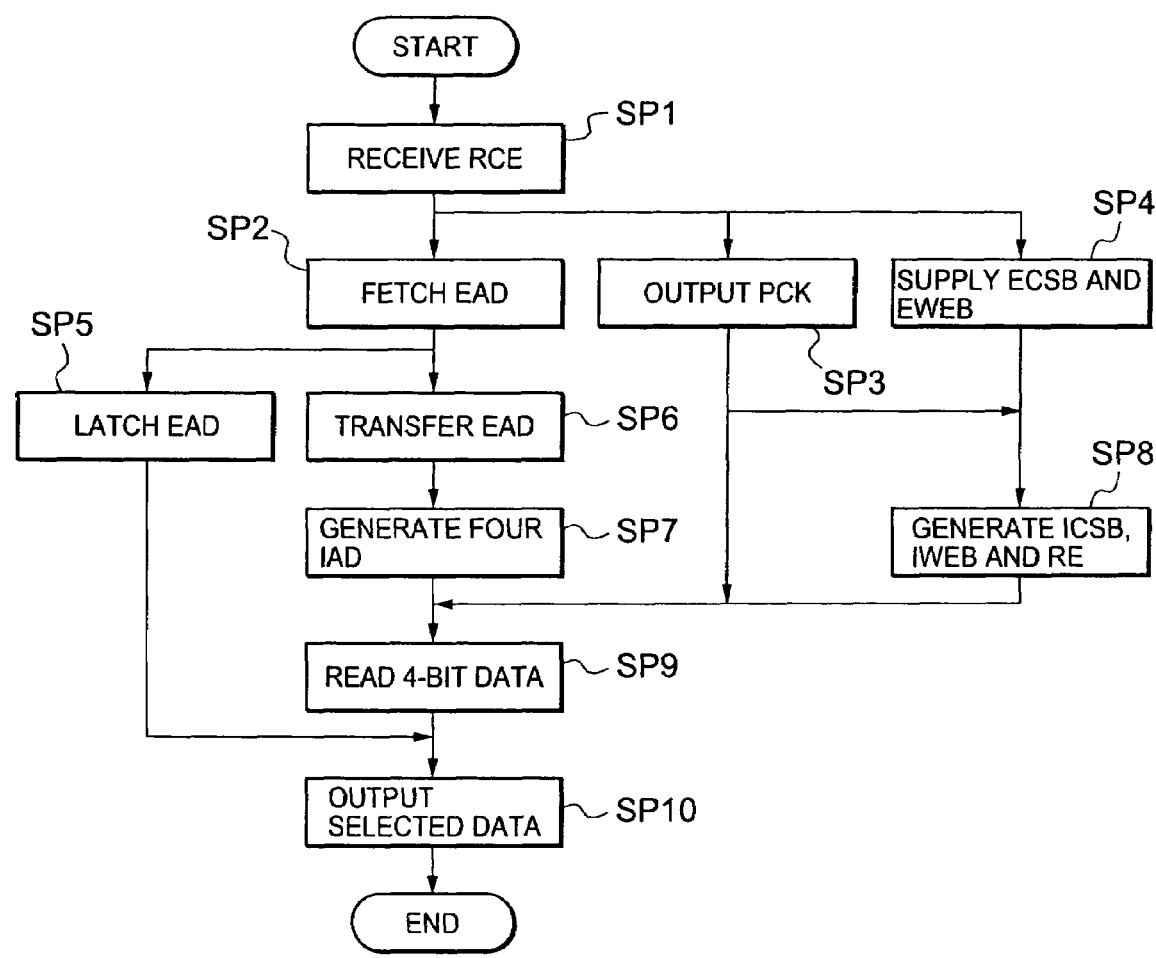
FIG. 7 depicts a flowchart for explaining the method for testing a semiconductor memory device.

Next, with reference to a flowchart shown in FIG. 7 and a timing chart shown in FIG. 8, the foregoing first to fourth read cycles TR1 to TR4 will be described in detail. Here, as one example, description will be given of the case where the above-described n is 4, that is, the PLL clock PCK has a frequency four times that of the external clock ECK and (2, 0), (3, 0), (0, 0) and (1, 0) are sequentially given as the external address EAD.

First, when the read command RCM is received (Step SP1 of FIG. 7) in the test circuit 11, the external address fetch/latch circuit 21 shown in FIG. 3 fetches the external address EAD ((2, 0) in this case) shown in FIG. 8 (2) in the first read cycle TR1 of the external clock ECK shown in FIG. 8 (1) (Step SP2) At the same time, in synchronization with rise of the external clock ECK, the PLL 14 outputs the PLL clock PCK (see FIG. 8 (5)) which has four pulses for one cycle of the external clock ECK, that is, has a frequency four times that of the external clock ECK (Step SP3). Simultaneously, the external chip select signal ECSB and the external write enable signal EWEB are supplied to the high-speed control signal generating circuit 15, the high-speed address generating circuit 16 and the high-speed data generating circuit 17 (Step SP4). Next, the external address fetch/latch circuit 21 shown in FIG. 3 latches the external address EAD and supplies the latched external address EAD to the high-speed data generating circuit 17 as a latch address LAD ((2, 0) in this case) (see FIG. 8 (4)) (Step SP 5). At the same time, the external address fetch/latch circuit 21 transfers the external address EAD to the internal address generating circuit 22 via the control bus 23 (Step SP6).

Next, in the second read cycle TR2 of the external clock ECK shown in FIG. 8 (1), the external address fetch/latch circuit 21 fetches the external address EAD ((3, 0) in this case) shown in FIG. 8 (2) (Step SP2). Thereafter, the external address fetch/latch circuit 21 latches the external address EAD and supplies the latched external address EAD to the high-speed data generating circuit 17 as a latch address LAD ((3, 0) in this case) (see FIG. 8 (4)) (Step SP5). At the same time, the external address fetch/latch circuit 21 transfers the external address EAD to the internal address generating circuit 22 via the control bus 23 (Step SP6).

Meanwhile, in synchronization with rise of the PLL clock PCK, the internal address generating circuit 22 generates four internal addresses IAD ((0, 0), (1, 0), (2, 0) and (3, 0) in this case) (see FIG. 8 (6)) which includes the external address EAD (3, 0) in this case) supplied from the external address fetch/latch circuit 21 via the control bus 23 (Step SP7)). Moreover, in the first and second read cycles TR1 and TR2 of the external clock ECK shown in FIG. 8 (1), in parallel with the above-described processing, the high-speed control signal generating circuit 15 generates the internal chip select signal ICSB and the internal write enable signal IWEB based on the external chip select signal ECSB and the external write enable signal EWEB. At the same time, based on the PLL clock PCK and the external address EAD, the high-speed control signal generating circuit 15 generates the read enable signal RE shown in FIG. 8 (7) (Step SP8).

Consequently, the four internal addresses IAD are supplied to the RAM macro 12 as four addresses AD ((0, 0), (1, 0), (2, 0) and (3, 0) in this case) via the connection switching circuit 18. Thus, four pieces of read data TQ are read from storage regions corresponding to the four addresses AD of the RAM macro 12 in synchronization with the clock CK supplied from the connection switching circuit 18 and are supplied to the high-speed data generating circuit 17 as four pieces of internal read data ITQ (4-bit data Q0 to Q3 in this case) (see FIG. 8 (8)) via the connection switching circuit 18 (Step SP9). In the high-speed data generating circuit 17, in the read data selecting circuit 24 shown in FIG. 4, the row address (Lx3, Lx2, Lx1, Lx0) included in the latch address LAD supplied from the external address fetch/latch circuit 21 and the row address (ix3, ix2, ix1, ix0) included in the internal address IAD supplied from the internal address generating circuit 22 are compared with each other. At the same time, the column address (Ly3, Ly2, Ly1, Ly0) included in the latch address LAD and the column address (iy3, iy2, iy1, iy0) included in the internal address IAD are compared with each other. When all bits of the row addresses and all bits of the column addresses coincide with each other, the selection signal RHIT of "H" level shown in FIG. 8 (9) is outputted from the 3-input AND gate 48 in synchronization with the PLL clock PCK. Therefore, from the transfer gate 55, only odd-numbered 1-bit data corresponding to the external address EAD ((3, 0) in this case) out of the four pieces of internal read data ITQ shown in FIG. 8 (8) is outputted.

Next, in the third read cycle TR3 of the external clock ECK shown in FIG. 8 (1), the external address fetch/latch circuit 21 fetches the external address EAD shown in FIG. 8 (2) ((0, 0) in this case) (Step SP2). Thereafter, the external address fetch/latch circuit 21 latches the external address EAD and supplies the latched external address EAD to the high-speed data generating circuit 17 as a latch address LAD ((0, 0) in this case) (see FIG. 8 (4)) (Step SP5). At the same time, the external address fetch/latch circuit 21 transfers the external address EAD to the internal address generating circuit 22 via the control bus 23 (Step SP6).

Meanwhile, in synchronization with rise of the PLL clock PCK, the internal address generating circuit 22 generates four internal addresses IAD ((0, 0), (1, 0), (2, 0) and (3, 0) in this case) (see FIG. 8 (6)) which include the external address EAD ((0, 0) in this case) supplied from the external address fetch/latch circuit 21 via the control bus 23 (Step SP7) Moreover, in the first and second read cycles TR1 and TR2 of the external clock ECK shown in FIG. 8 (1), in parallel with the above-described processing, the high-speed control signal generating circuit 15 generates the internal chip select signal ICSB and the internal write enable signal IWEB based on the external chip select signal ECSB and the external write enable signal EWEB. At the same time, based on the PLL clock PCK and the external address EAD, the high-speed control signal generating circuit 15 generates the read enable signal RE shown in FIG. 8 (7) (Step SP8).

Consequently, the four internal addresses IAD are supplied to the RAM macro 12 as four addresses AD ((0, 0), (1, 0), (2, 0) and (3, 0) in this case) via the connection switching circuit 18. Thus, four pieces of read data TQ are read from storage regions corresponding to the four addresses AD of the RAM macro 12 in synchronization with the clock CK supplied from the connection switching circuit 18 and are supplied to the high-speed data generating circuit 17 as four pieces of internal read data ITQ (4-bit data Q0 to Q3 in this case) (see FIG. 8 (8)) via the connection switching circuit 18 (Step SP9). In the high-speed data generating circuit 17, in the read data selecting circuit 24 shown in FIG. 4, the row address (Lx3, Lx2, Lx1, Lx0) included in the latch address LAD supplied from the external address fetch/latch circuit 21 and the row address (ix3, ix2, ix1, ix0) included in the internal address IAD supplied from the internal address generating circuit 22 are compared with each other. At the same time, the column address (Ly3, Ly2, Ly1, Ly0) included in the latch address LAD and the column address (iy3, iy2, iy1, iy0) included in the internal address IAD are compared with each other. When all bits of the row addresses and all bits of the column addresses coincide with each other, the selection signal RHIT of "H" level shown in FIG. 8 (9) is outputted from the 3-input AND gate 48 in synchronization with the PLL clock PCK. Therefore, from the transfer gate 55, only even-numbered 1-bit data corresponding to the external address EAD (0, 0) in this case) out of the four pieces of internal read data ITQ shown in FIG. 8 (8) is outputted.

Furthermore, in the data-out buffer circuit 25 shown in FIG. 4, the latch 64 latches the 1-bit data (the data Q2 in this case) outputted from the transfer gate 55. Meanwhile, in the read data selecting circuit 24, the data enable signal DE shown in FIG. 8 (11) is generated based on the external clock ECK and the read enable signal RE. Thus, in the data-out buffer circuit 25, the 1-bit data (the data Q2 in this case) latched by the latch 64 is outputted from the transfer gate 67 opened by output data of the AND gate 62 synchronized with fall of the external clock ECK and is outputted as the external read data ETQ shown in FIG. 8 (12) after being inverted by the inverter 69 (Step SP10). Therefore, in an unillustrated test device, in synchronization with the external clock ECK, it is possible to determine in real time, based on the value of the external read data ETQ corresponding to the external address EAD one-on-one, whether one memory cell corresponding to the external address EAD of the RAM macro 12 is usable (pass) or not usable (fail).

Next, in the fourth read cycle TR4 of the external clock ECK shown in FIG. 8 (1), the external address fetch/latch circuit 21 fetches the external address EAD shown in FIG. 8 (2) ((1, 0) in this case) (Step SP2). Thereafter, the external address fetch/latch circuit 21 latches the external address EAD and supplies the latched external address EAD to the high-speed data generating circuit 17 as a latch address LAD ((1, 0) in this case) (see FIG. 8 (4)) (Step SP5). At the same time, the external address fetch/latch circuit 21 transfers the external address EAD to the internal address generating circuit 22 via the control bus 23 (Step SP6).

Meanwhile, in synchronization with rise of the PLL clock PCK, the internal address generating circuit 22 generates four internal addresses IAD ((0, 0), (1, 0), (2, 0) and (3, 0) in this case) (see FIG. 8 (6)) which include the external address EAD (1, 0) in this case) supplied from the external address fetch/latch circuit 21 via the control bus 23 (Step SP7). Moreover, in the third and fourth read cycles TR3 and TR4 of the external clock ECK shown in FIG. 8 (1), in parallel with the above-described processing, the high-speed control signal generating circuit 15 generates the internal chip select signal ICSB and the internal write enable signal IWEB based on the external chip select signal ECSB and the external write enable signal EWEB. At the same time, based on the PLL clock PCK and the external address EAD, the high-speed control signal generating circuit 15 generates the read enable signal RE shown in FIG. 8 (7) (Step SP8).

Consequently, the four internal addresses IAD are supplied to the RAM macro 12 as four addresses AD ((0, 0), (1, 0), (2, 0) and (3, 0) in this case) via the connection switching circuit 18. Thus, four pieces of read data TQ are read from storage regions corresponding to the four addresses AD of the RAM macro 12 in synchronization with the clock CK supplied from the connection switching circuit 18 and are supplied to the high-speed data generating circuit 17 as four pieces of internal read data ITQ (4-bit data Q0 to Q3 in this case) (see FIG. 8 (8)) via the connection switching circuit 18 (Step SP9). In the high-speed data generating circuit 17, in the read data selecting circuit 24 shown in FIG. 4, the row address (Lx3, Lx2, Lx1, Lx0) included in the latch address LAD supplied from the external address fetch/latch circuit 21 and the row address (ix3, ix2, ix1, ix0) included in the internal address IAD supplied from the internal address generating circuit 22 are compared with each other. At the same time, the column address (Ly3, Ly2, Ly1, Ly0) included in the latch address LAD and the column address (iy3, iy2, iy1, iy0) included in the internal address IAD are compared with each other. When all bits of the row addresses and all bits of the column addresses coincide with each other, the selection signal RHIT of "H" level shown in FIG. 8 (9) is outputted from the 3-input AND gate 48 in synchronization with the PLL clock PCK. Therefore, from the transfer gate 55, only odd-numbered 1-bit data corresponding to the external address EAD (1, 0) in this case) out of the four pieces of internal read data ITQ shown in FIG. 8 (8) is outputted.

Furthermore, in the data-out buffer circuit 25 shown in FIG. 4, the latch 64 latches the 1-bit data (the data Q3 in this case) outputted from the transfer gate 55. Meanwhile, in the read data selecting circuit 24, the data enable signal DE shown in FIG. 8 (11) is generated based on the external clock ECK and the read enable signal RE. Thus, in the data-out buffer circuit 25, the 1-bit data (the data Q3 in this case) latched by the latch 64 is outputted from the transfer gate 67 opened by output data of the AND gate 62 synchronized with fall of the external clock ECK and is outputted as the external read data ETQ shown in FIG. 8 (12) after being inverted by the inverter 69 (Step SP10). Therefore, in an unillustrated test device, in synchronization with the external clock ECK, it is possible to determine in real time, based on the value of the external read data ETQ corresponding to the external address EAD one-on-one, whether one memory cell corresponding to the external address EAD of the RAM macro 12 is usable (pass) or not usable (fail).

Note that subsequent operations are different from the above-described only in data to be outputted and thus description thereof will be omitted.

As described above, according to the configuration of this embodiment, it is made possible to realize write and read of data into and from the RAM macro 12 at high speed in the test circuit 11 by use of the PLL clock PCK which is synchronized with the low-speed external clock ECK and has a frequency n times that of the external clock ECK. In addition, it is made possible to perform read of 1-bit data corresponding to the external address EAD one-on-one in synchronization with the external clock ECK. Therefore, it is possible to determine in real time whether one memory cell of the RAM macro 12 corresponding to the read 1-bit data is usable (pass) or not usable (fail). Thus, the above-described method for testing a semiconductor memory device can be used in the probing test step of examining electrical characteristics and the like of the RAM macro 12 and performing rescue of memory cells in which a row including defective memory cells or a column including defective memory cells is replaced with a row of redundant memory cells or a column thereof. Moreover, in the above-described method for testing a semiconductor memory device, write of n number of the internal write data ITD is performed in synchronization with the high-speed PLL clock PCK only by supplying one external address EAD to the test circuit 11. Thus, a test time can be accordingly shortened.

The embodiment of the present invention has been described above in detail with reference to the drawings. However, the specific configuration is not limited to this embodiment and changes of design and the like without departing from the scope of the invention are included in the invention.

For example, in the above-described embodiment, the description was given of the example using the PLLC as the circuit generating the internal clock obtained by multiplying the external clock. However, without being limited thereto, a delay locked loop circuit (DLLC) may be used.

Moreover, in the above-described embodiment, the description was given of the example where the external address EAD supplied from the outside in the write cycle TW shown in FIG. 6 is the same as the external address EAD supplied from the outside in the first read cycle TR1. However, without being limited thereto, the above-described external addresses EAD may be different from each other.

Moreover, in the above-described embodiment, the description was given of the example where, in synchronization with the rise of the PLL clock PCK, the internal address generating circuit 22 generates the four internal addresses IAD including the external address EAD supplied from the external address fetch/latch circuit 21 via the control bus 23. However, there is no limitation in this regard. For example, the internal address generating circuit 22 may be configured to generate the four internal addresses IAD including the external address EAD supplied from the external address fetch/latch circuit 21 via the control bus 23 in synchronization with the fall of the PLL clock PCK.

Moreover, in the above-described embodiment, the example where n is 4 was described. However, without being limited thereto, n may be any of 2, 3, 5, 6, 7, 8, 12, 16, 32 and 64.

Moreover, in the above-described embodiment, the description was given of the example where the present invention is applied to the test of the semiconductor memory device having the RAM macro. However, without being limited thereto, the present invention can be also applied to a single piece of a semiconductor memory device such as a SRAM or to a SOC and an ASIC (Application Specific Integrated Circuit) on which semiconductor memory devices such as the SRAM and a DRAM are mixedly mounted. As the foregoing DRAM, besides a normal synchronous DRAM, there are a synchronous DRAM capable of a DDR (Double Data Rate) operation and a DRAM capable of high-speed data transfer, called Rambus DRAM (trademark). Here, the DDR operation means an operation performed at a data transfer rate twice as fast as that of a conventional synchronous DRAM by controlling input/output of data in synchronization with both edges including rise and fall of a clock.

As described above, according to the configuration of the present invention, in synchronization with a high-speed clock which has a frequency n times that of an external clock (n is a natural number) and is synchronized with the external clock, n number of internal addresses including an external address supplied for designating a storage region of data for 1 bit to be written into a storage unit of a semiconductor memory device are generated. In addition, the present invention includes: a first step in which n bits of internal write data corresponding to n number of the internal addresses are generated in synchronization with the high-speed clock and are written into the storage unit; and a second step in which the external address supplied for designating the storage region of data for 1 bit to be read from the storage unit is latched, n number of the internal addresses including the external address are generated in synchronization with the high-speed clock, n bits of internal read data corresponding to n number of the internal addresses are read from the storage unit in synchronization with the high-speed clock and the internal read data corresponding to the internal address, which coincides with the latched external address, out of n number of the internal addresses is outputted.

Therefore, even in the case of using a high-speed internal clock obtained by multiplying a low-speed external clock, read data corresponding to one external address one-on-one can be obtained. Moreover, a write time of data into a storage unit is reduced to one-nth of a normal write time and thus a test time can be accordingly shortened.

It is apparent that the present invention is not limited to the above embodiments, but may be modified and changed without departing from the scope and spirit of the invention.

What is claimed is:

1. A method for testing a semiconductor memory device, comprising:
   a first step of generating n number of internal addresses including a first external address supplied for designating a storage region of data for 1 bit to be written into a storage unit of a semiconductor memory device, in synchronization with a high-speed clock which has a frequency n times that of an external clock, n being a natural number, and is synchronized with the external clock, generating n bits of internal write data corresponding to n number of the internal addresses in synchronization with the high-speed clock and writing the generated internal write data into the storage unit, a first data generating method of generating the n bits of the internal write data being consecutively generating n number values of "1"; and
   a second step of latching a second external address supplied for designating a storage region of data for 1 bit to be read from the storage unit, generating n number of second internal addresses including the second external address in synchronization with the high-speed clock, reading n bits of internal read data corresponding to n number of the second internal addresses from the storage unit in synchronization with the high-speed clock and outputting the internal read data corresponding to the second internal address, which coincides with the latched second external address, out of n number of the internal addresses.

2. The method for testing a semiconductor memory device, according to claim 1, wherein
   in the second step, 1 bit of the internal read data read from the storage unit in accordance with one of n number of the internal addresses, which coincides with the latched second external address and is synchronized with the high-speed clock, is outputted.

3. The method for testing a semiconductor memory device, according to claim 1, wherein
   n number of the first and second internal addresses are generated by use of any one of a first address generating method of generating the first and second internal addresses by sequentially increasing an address of the first and second external addresses, respectively, a second address generating method of generating the first and second internal addresses by sequentially decreasing the address of the first and second external addresses, respectively, and a third address generating method of generating the first and second internal addresses within a range which includes first and second the external addresses, respectively, and is separated by n.

4. The method for testing a semiconductor memory device, according to claim 1, wherein
   additional data generating methods of generating the n bits of the internal write data are a second data generating method of consecutively generating n number of values of "0", a third data generating method of alternately repeating the values "1" and "0" in this order and a fourth data generating method of alternately repeating the values "0" and "1" in this order.

5. A test circuit for a semiconductor memory device, comprising:
   a high-speed clock generating circuit which generates a high-speed clock which has a frequency n times that of an external clock, n being a natural number, and is synchronized with the external clock;
   a high-speed address generating circuit which generates, in synchronization with the high-speed clock, n number of first internal addresses including a first external address supplied for designating a storage region of data for 1 bit to be written into a storage unit of a semiconductor memory device, latches a second external address supplied for designating a storage region of data for 1 bit to be read from the storage unit, outputs the second external address as a latch address and generates n number of second internal addresses including the second external address in synchronization with the high-speed clock; and
   a high-speed data generating circuit which generates n bits of internal write data corresponding to n number of the first internal addresses in synchronization with the high-speed clock, a first data generating method of generating the n bits of the internal write data being consecutively generating n number of values of "1", and supplies the internal write data to the storage unit and outputs internal read data corresponding to one of n number of the second internal addresses, which coincides with the latch address, out of n bits of the internal read data read from the storage unit in synchronization with the high-speed clock.

6. The test circuit for a semiconductor memory device, according to claim 5, wherein the high-speed data generating circuit outputs 1 bit of the internal read data read from the storage unit in accordance with one of n number of the internal addresses, which coincides with the latch address and is synchronized with the high-speed clock.

7. The test circuit for a semiconductor memory device, according to claim 5, wherein the high-speed address generating circuit includes any one of first address generating means for generating the internal addresses by sequentially increasing an address of the external address, second address generating means for generating the internal addresses by sequentially decreasing the address of the external address and third address generating means for generating the internal addresses within a range which includes the external address and is separated by n.

8. The test circuit for a semiconductor memory device, according to claim 5, wherein additional data generating methods of generating the n bits of the internal write data are a second data generating method of consecutively generating n number of values of "0", a third data generating method of alternately repeating the values "1" and "0" in this order and a fourth data generating method of alternately repeating the values "0" and "1" in this order.

9. The test circuit for a semiconductor memory device, according to claim 5, wherein
the high-speed address generating circuit includes an external address fetch/latch circuit and an internal address generating circuit,
the external address fetch/latch circuit fetches the external address, latches the external address to be supplied to the high-speed data generating circuit as a latch address and transfers the fetched external address to the internal address generating circuit, and
the internal address generating circuit generates, in synchronization with the high-speed clock, n number of the internal addresses including the external address supplied from the external address fetch/latch circuit.

* * * * *